United States Patent [19]

Futatsuka et al.

[11] Patent Number: 5,463,247
[45] Date of Patent: Oct. 31, 1995

[54] LEAD FRAME MATERIAL FORMED OF COPPER ALLOY FOR RESIN SEALED TYPE SEMICONDUCTOR DEVICES

[75] Inventors: Rensei Futatsuka; Shunichi Chiba; Junichi Kumagai, all of Aizuwakamatsu, Japan

[73] Assignee: Mitsubishi Shindoh Co., Ltd., Tokyo, Japan

[21] Appl. No.: 196,316

[22] Filed: Feb. 15, 1994

Related U.S. Application Data

[63] Continuation-in-part of Ser. No. 72,887, Jun. 7, 1993, abandoned.

[30] Foreign Application Priority Data

Jun. 11, 1992 [JP] Japan .................................. 4-177500

[51] Int. Cl.⁶ .......................... H01L 23/48; H01L 29/44; H01L 29/52; H01L 29/60
[52] U.S. Cl. ........................... 257/666; 257/741; 420/469
[58] Field of Search ..................... 257/741, 666; 420/469

[56] References Cited

U.S. PATENT DOCUMENTS

| | | | |
|---|---|---|---|
| 4,337,089 | 6/1982 | Arita et al. | 420/471 |
| 4,612,167 | 9/1986 | Watanabe et al. | 420/471 |
| 4,668,471 | 5/1987 | Futatsuka et al. | 420/470 |
| 4,732,733 | 3/1988 | Sakamoto et al. | 420/471 |
| 4,822,560 | 4/1989 | Oyama et al. | 420/470 |
| 5,015,803 | 5/1991 | Mahulikar et al. | 420/471 |

FOREIGN PATENT DOCUMENTS 63-297531 12/1988 Japan .
2-111828 4/1990 Japan .

*Primary Examiner*—Robert P. Limanek
*Assistant Examiner*—T. M. Arroyo
*Attorney, Agent, or Firm*—Frishauf, Holtz, Goodman, Langer & Chick

[57] ABSTRACT

There is provided a lead frame material formed of a Cu alloy for a resin sealed type semiconductor device, wherein the Cu alloy consists essentially of 2 to 4% Ni, more than 0.5 to 1%, Si, 0.1 to 2% Zn, more than 0.01 to 0.05%, Mg, 0.05 to 1% Sn, and the balance of Cu and inevitable impurities, the inevitable impurities containing 20 ppm or less sulfur (S) and 20 ppm or less carbon (C). The lead frame material formed of the Cu alloy has improved adhesion strength to an epoxy resin as a sealing material. A semiconductor device prepared from said lead frame material is also provided.

8 Claims, 3 Drawing Sheets

LEAD FRAME MATERIAL FORMED OF COPPER ALLOY FOR RESIN SEALED TYPE SEMICONDUCTOR DEVICES

This is a continuation-in-part application of application Ser. No. 08/072,887, filed Jun. 7, 1993, now abandoned, the entire contents of which are hereby incorporated by reference.

BACKGROUND OF THE INVENTION

1. Field of the Invention

This invention relates to a lead frame material formed of a copper alloy for use in a resin sealed type semiconductor device having high adhesion strength to an epoxy resin sealing material and leads for a semiconductor device.

2. Prior Art

Conventionally, transistors, IC's, and further, LSI's are known in general as semiconductor devices. Among them, e.g. a resin sealed type IC is produced by the following known method, which comprises the essential steps of:

(a) preparing, as a lead frame material, a Cu-alloy strip having a plate thickness of 0.1 to 0.3 mm;

(b) forming from the above lead frame material by etching or punching a lead frame suitable in shape for an IC to be produced;

(c) effecting heat adhesion of semiconductor chips of Si, Ge, etc., each having a high purity to predetermined locations of the lead frame, by the use of an electrically conductive resin, such as an Ag paste, or alternatively soldering or Au-brazing the semiconductor chips through plated layers formed of Au, Ag, Pd, Ni, Cu, or an alloy thereof, which have been formed by plating partly or entirely on one side surface of each of the semiconductor chips and the lead frame material;

(d) connecting the semiconductor chips to the lead frame by means of bonding wires, such as an extra fine wire of Au and an extra fine wire of Cu;

(e) subsequently sealing, for protection, the semiconductor chips, the bonding wires, and the lead frame with the semiconductor chips mounted thereon, by the use of an epoxy resin as a sealing material; and (f) finally cutting off border portions of the lead frame between adjacent chip-mounted portions thereof, and plating fixture legs of the lead frame with an Sn-Pb alloy soldering material according to the customary dipping technique, electrical method, or the like.

In producing the above-mentioned resin sealed type semiconductor device, various types of Cu alloys are used as lead frame materials. Among them is known a Cu alloy having a chemical composition consisting essentially, by weight percent (hereinafter referred to simply as "%"), of 1 to 4% Ni, 0.1 to 1% Si, 0.1 to 2% Zn, 0.001 to 0.05% Mg, and the balance of Cu and inevitable impurities. It is also known that this Cu alloy is excellent in strength as well as solder-heat exfoliation resistance, so that it now finds wide practical applications.

On the other hand, the development of semiconductor devices with greater integration is conspicuous in recent years, and accordingly, the above-mentioned resin sealed type semiconductor devices are forced to operate under severe conditions. However, the conventional lead frame material formed of the above-mentioned Cu alloy for forming the sealed type semiconductor devices does not have satisfactory adhesion strength to an epoxy resin as a sealing material, so that exfoliation is likely to occur after use for a relatively short time period. As a result, ambient air (especially moisture) penetrates into a slight gap formed between the lead frame and the sealing material, thereby causing erosion of components of the semiconductor device. Thus, the conventional lead frame materials have unsatisfactory reliability.

SUMMARY OF THE INVENTION

It is therefore the object of the invention to provide a lead frame material formed of a Cu alloy for use in a resin sealed type semiconductor device, which is excellent in adhesion strength to an epoxy resin as a sealing material.

In order to attain the above object, the present invention provides a lead frame material formed of a copper alloy which consists essentially of 2 to 4% Ni, more than 0.5 to 1%, Si, 0.1 to 2% Zn, more than 0.01 to 0.05%, Mg, 0.05 to 1% Sn, and the balance of Cu and inevitable impurities, said inevitable impurities containing 20 ppm or less sulfur (S) and 20 ppm or less carbon (C).

The invention also provides a semiconductor having leads, said leads comprising the lead frame material of the present invention.

The above and other objects, features and advantages of the invention will be more apparent from the ensuing detailed description.

DETAILED DESCRIPTION

Figure 1:
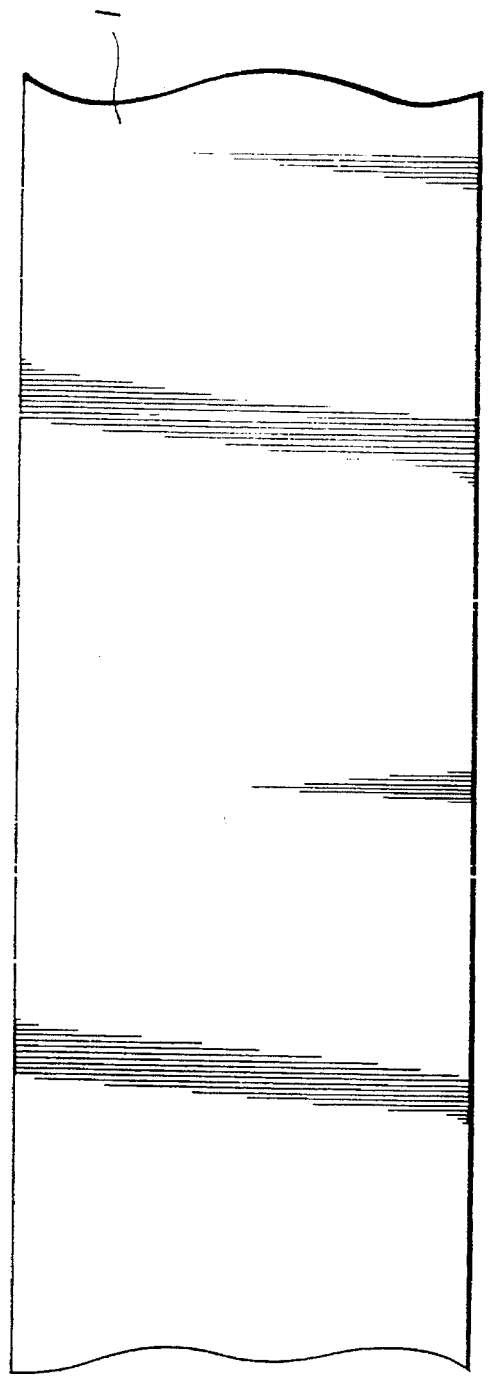
FIGS. 1–7 are plan views respectively illustrating processes of adapting a copper alloy lead frame material according to the invention as leads of a semiconductor device.

Under the aforestated circumstances, the present inventors have made studies in order to obtain a lead frame material formed of a Cu alloy for use in a resin sealed type semiconductor device which is excellent in adhesion strength to an epoxy resin as a sealing material, and have reached the following finding:

If a lead frame material formed of a Cu alloy is used, which has a chemical composition obtained by selecting from the chemical composition of the aforementioned conventional Cu alloy one consisting essentially of 2 to 4% Ni, more than 0.5 to 1%, Si, 0.1 to 2% Zn, more than 0.01 to 0.05%, Mg, and the balance of Cu and inevitable impurities, and further 0.05 to 1% Sn is added as an alloy component to the selected chemical composition, while the contents of sulfur and carbon contained therein as inevitable impurities, being both reduced to 20 ppm or less, the resulting lead frame material formed of the Cu alloy has its adhesion strength to the sealing material of the epoxy resin drastically improved without degradation in its strength and solder-heat exfoliation resistance. Thus, the exfoliation of the lead frame material can be minimized even when it is put into service under severe conditions.

The present invention is based upon the above finding.

Specifically, this invention provides a lead frame material formed of a Cu alloy which consists essentially of 2 to 4% Ni, more than 0.5 to 1%, Si, 0.1 to 2% Zn, more than 0.01 to 0.05%, Mg, 0.05 to 1% Sn, and the balance of Cu and inevitable impurities, the inevitable impurities containing 20 ppm or less sulfur (S) and 20 ppm or less carbon (C).

The contents of the component elements of the Cu alloy according to the invention have been limited as previously stated, for the following reasons:

(a) Nickel (Ni) and Silicon (Si):

Both of these elements are chemically combined and cooperatively act to #form intermetallic compounds comprising $Ni_2Si$ which are finely deposited and dispersed in the basis of the alloy, thereby increasing he strength thereof. However, when the nickel content is less than 2% or the silicon content is 0.5% or less, a desired increase in the strength to an excellent value cannot be obtained. On the other hand, when the nickel content exceeds 4%, the electric conductivity of the alloy decreases. Further, when the silicon content exceeds 1%, it will result in degraded hot workability. Therefore, the nickel and the silicon contents are limited within the ranges of 2 to 4% and more than 0.5 to 1%, respectively. Preferably, the nickel and the silicon contents should be within the ranges of 2.0 to 3.8%, and 0.51% to 0.9%, respectively.

(b) Zinc (Zn)

Zinc acts to improve the solder-heat exfoliation resistance. However, if the zinc content is less than 0.1%, the above action cannot be performed to a desired extent. On the other hand, when the zinc content exceeds 2%, it sharply lowers the electric conductivity. Therefore, the zinc content is limited within the range of 0.1 to 2%, preferably within the range of 0.2 to 1.5%.

(c) Magnesium (Mg)

Magnesium acts to improve the hot workability. However, when the magnesium content is 0.01% or less, a desired increase in the hot workability to an excellent value cannot be obtained. On the other hand, even when the magnesium content exceeds 0.05%, a further increase in the hot workability cannot be expected. Therefore, the magnesium content is limited within the range of more than 0.01 to 0.05%, preferably within the range of 0.015 to 0.03%.

(d) Tin (Sn)

Tin acts to improve the adhesion strength of the lead frame material to an epoxy resin as a sealing material, as mentioned above. However, when the tin content is less than 0.05%, a desired increase in the adhesion strength cannot be obtained. On the other hand, when the tin content exceeds 1%, the electric conductivity decreases. Therefore, the tin content is limited within the range of 0.05 to 1%, preferably within the range of 0.15 to 0.8%.

(e) Sulfur (S) and Carbon (C) as Inevitable Impurities cu alloys of this type contain, in general, sulfur and carbon in an amount of 30 ppm or less, individually. However, if the sulfur and carbon amounts are not both limited to 20 ppm or less, a desired increase in the adhesion strength ascribable to Sn as mentioned above cannot be obtained. Therefore, the sulfur and the carbon contents are both limited to 20 ppm or less. Preferably, they should be limited to 15 ppm or less and 10 ppm or less, respectively.

The manner of using the Cu alloy lead frame material according to the present invention as leads of a semiconductor device will be explained, with reference to the accompanying drawings.

Figure 2:
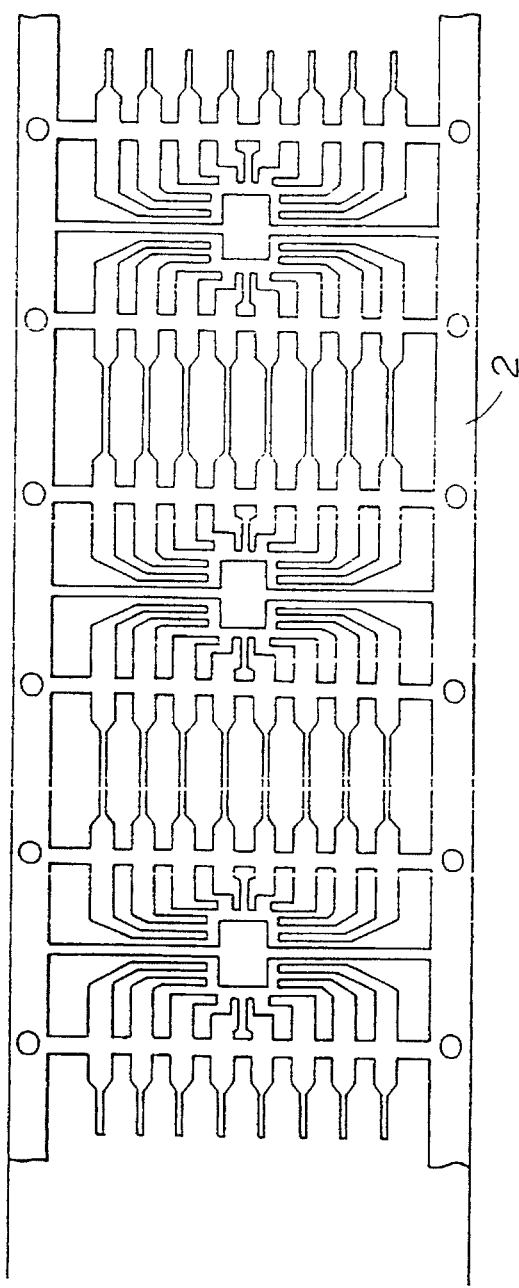
Figure 3:
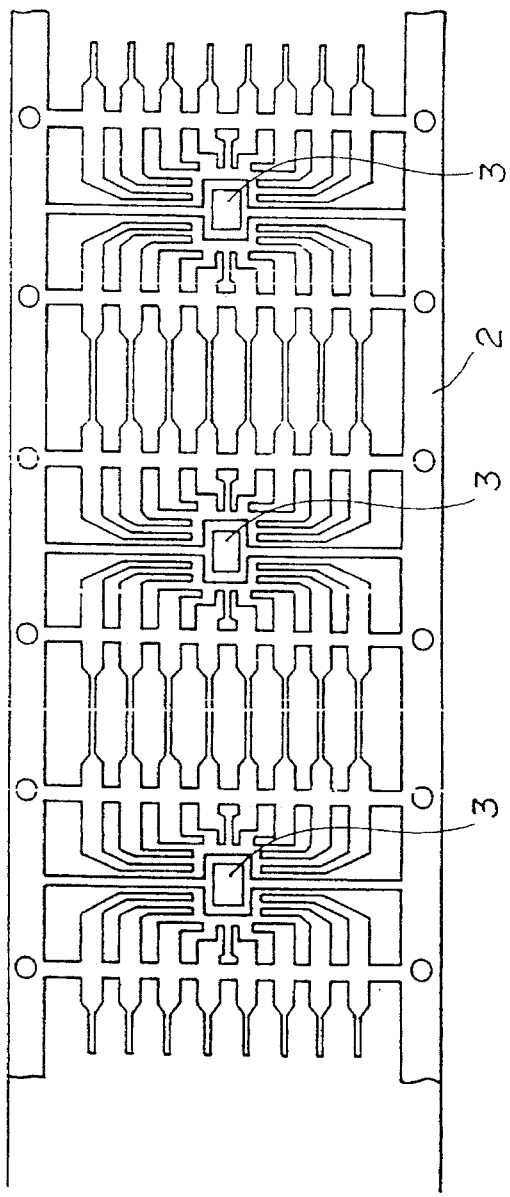
Figure 4:
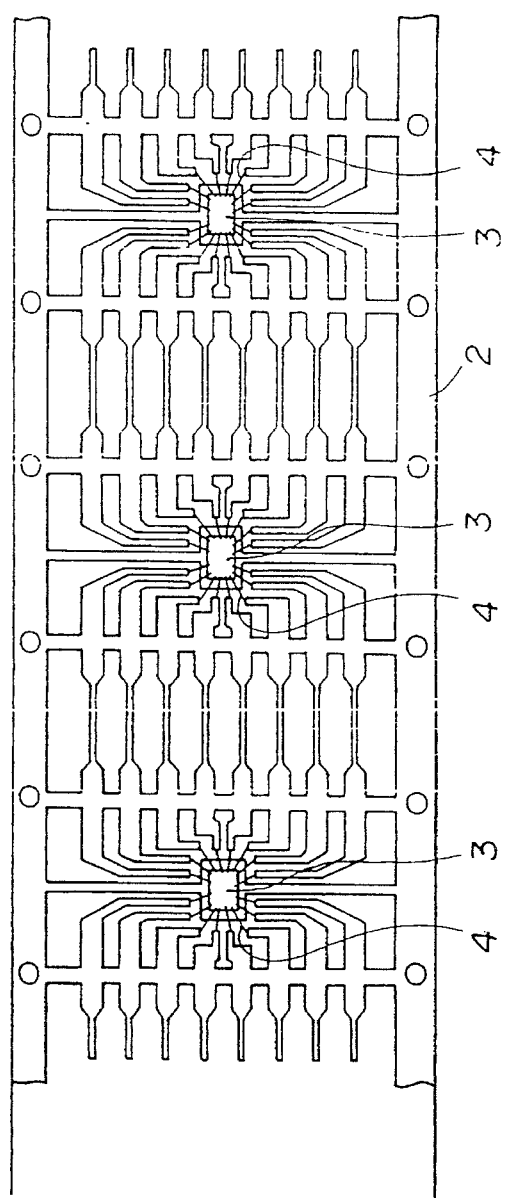
Figure 5:
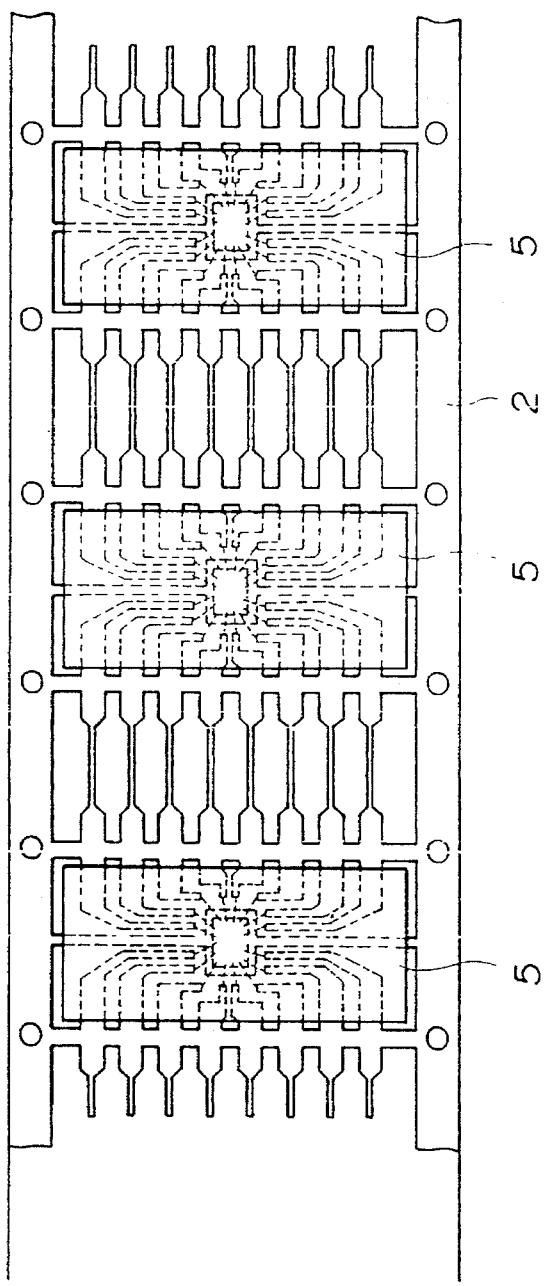
Figure 7:
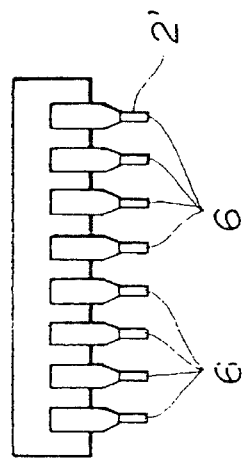
Figure 6:
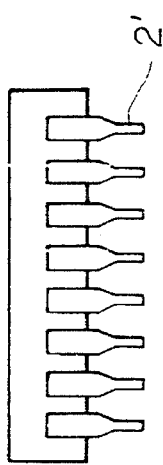

First, as shown in FIG. 1, a copper alloy lead strip 1 having a thickness within a range from 0.1 to 0.3 mm is prepared from a molten copper alloy having a predetermined chemical composition, as a material for leads of a semiconductor device. Preferably, a major surface of the lead strip 1 may be partly or entirely plated with one or more plating layers of at least one metal selected from the group consisting of Au, Ag, Pd, and Ni. Then, the lead strip 1 is stamped into a lead frame 2 having a shape suitable for use in the semiconductor device which is to be manufactured (Fig. 2). Alternatively of forming the plating layer(s) on the lead strip 1, the lead frame 2 obtained by the stamping may be formed with one or more similar plating layers. Semiconductor chips 3, in which are incorporated elements including semiconductor elements of high purity Si, Ga—As alloy, or the like, are mounted onto the lead frame 2 at its predetermined surface portions (FIG. 3), by hot bonding at a temperature within a range from 200°–350° C. using a conductive resin such as Ag paste. The semiconductor chips 3 may preferably be mounted on the lead frame 2 at its predetermined surface portions by thermocompression bonding at a temperature within a range from 300°–400° C. through the one or more plating layers. Then, elements of the semiconductor chips 3 are connected to the lead frame 2 by wire bonding using Au wires 4 (FIG. 4). The semiconductor chips 3, the wire bonding portions, the surface portions of the lead frame 2, on which the semiconductor chips 3 have been mounted, etc. are encapsulated by a plastic resin 5 for protection of same (FIG. 5). Then, the lead frame 2 is cut along boundaries between adjacent ones of the semiconductor chip-mounted surface portions, to form leads 2' of the semiconductor device (FIG. 6). Finally, the whole or part of the surface of the leads 2' is plated with a solder 6 of an Sn—Pb alloy by dipping, to solder the leads 2' to the substrate of the semiconductor device (FIG. 7).

EXAMPLES

Examples of the present invention will now be explained hereinbelow, to show that the copper alloy lead frame material according to the present invention has excellent properties as compared to the conventional copper alloy lead material.

Molten Cu alloys having chemical compositions shown in Tables 1 to 3 were prepared in a conventional high-frequency induction smelting furnace. The thus prepared molten alloys were individually cast by an ordinary semicontinuous casting method to form Cu alloy ingots each having a size of 150 mm in thickness, 500 mm in width, and 3000 mm in length. The ingots were each hot rolled at an initial hot rolling temperature of 950° C. into a hot rolled plate having a thickness of 11 mm. Each of the hot rolled plates was water cooled and then had its upper and lower sides scalped to a thickness of 10 mm, followed by repeated cold rolling, annealing, and pickling, thereby obtaining a cold rolled sheet having a thickness of 0.4 mm. Then, the thus obtained cold rolled sheets were subjected to a continuous solution treatment by maintaining them at a temperature of 900° C. for 2 minutes and then water cooling. The thus treated plates were further subjected to final cold rolling to obtain cold rolled sheets each having a thickness of 0.25 mm, followed by aging treatment at temperature of 450° C. for 3 hours, thereby obtaining lead frame materials Nos. 1 to 11 according to the present invention, conventional lead frame materials Nos. 1 to 9 which had no Sn content as an alloy component, and comparative frame materials Nos. 1 to 7 which were each formed of a Cu alloy having one of the component elements falling outside the range of the present invention, as asterisked in Table 3.

Then, the resulting lead frame materials were subjected to measurements as to Vickers hardness (load: 500 g) in order to evaluate the strength and as to electric conductivity, and further subjected to tests as to adhesion strength to an epoxy resin as well as solder-heat exfoliation resistance.

The test as to solder-heat exfoliation resistance was conducted as follows: Test pieces each having a size of 15 mm in width and 60 mm in length were each treated in a rosin flux, and then dipped into a solder bath filled with molten solder of a 60% Sn 40% Pb alloy at a temperature of 230° C., thereby plating the surface thereof with the above solder. Then, each of the plated test pieces was heated in air at 150° C. for 1000 hours, followed by bending at the center by 180 degrees flat on itself and bending back by 180 degrees to make return to the original shape, thereby evaluating the solder-heat exfoliation resistance of the lead frame formed of the Cu alloy when bent. The test pieces were each examined as to the absence or presence of exfoliation of solder on the bent portion.

The test as to adhesion strength to an epoxy resin was conducted as follows: Test pieces each having a plate size of 20 mm×20 mm were each charged into a metal mold of a resin injection molder, and the whole of the mold and the test piece was heated at a temperature of 175° C. for 20 minutes, followed by blowing an epoxy resin to thereby form a composite piece comprised of the above test piece and an epoxy resin piece bonded thereto at the center of one side surface thereof, the epoxy resin piece having a size of 15 mm in diameter and 20 mm in length. Then, each of the composite pieces was subjected to a pressure cracker test under an ambient pressure of 2 atm. at a temperature of 85° C. and at a humidity of 85% for 24 hours. Subsequently, a heat treatment was performed by soaking the composite piece in air at a temperature of 215° C. for 1 minute. Thus, the adhesion strength of the test piece to the epoxy resin piece was measured. The measured results are shown in Tables 1 to 3.

From the results shown in Tables 1 to 3, it is apparent that the lead frame materials Nos. 1 to 11 according to the present invention are much superior in adhesion strength to an epoxy resin as a sealing material to the conventional lead frame materials Nos. 1 to 9 which have no Sn content as an alloy component, while exhibiting strength (hardness), electric conductivity, and solder-heat exfoliation resistance which are as high as the conventional lead frame materials. On the other hand, the comparative lead frame materials Nos. 1 to 7, each of which has one of the contents of the composition falling outside the range of the present invention (asterisked in Table 3), are inferior in at least one of the properties of strength, electric conductivity, and solder-heat exfoliation to the lead frame material according to the present invention.

As described above, the Cu alloy lead frame material according to the present invention possesses remarkably high adhesion strength to an epoxy resin as a sealing material, and therefore, in a resin sealed type semiconductor device, where the lead frame material according to the present invention is incorporated, the lead frame material is free from exfoliation from the sealing material even if it is put into service under severe conditions, whereby high reliability can be obtained.

TABLE 2

| TEST PIECES | | CHEMICAL COMPOSITION (WT %) | | | | | IMPURITIES (ppm) | | Cu AND OTHER IMPURITIES | HARD-NESS (Hv) | ELECTRIC CONDUCTIVITY (% IACS) | SOLDER-HEAT EXFOLIATION | BONDING STRENGTH (kgf/mm²) |
|---|---|---|---|---|---|---|---|---|---|---|---|---|---|
| | | Ni | Si | Zn | Mg | Sn | S | C | | | | | |
| LEAD FRAME MATERIALS OF PRESENT INVENTION | 1 | 2.05 | 0.56 | 1.01 | 0.026 | 0.50 | 3 | 3 | BAL. | 251 | 44 | ABSENT | 0.167 |
| | 2 | 2.53 | 0.52 | 0.98 | 0.023 | 0.56 | 3 | 3 | BAL. | 264 | 37 | ABSENT | 0.162 |
| | 3 | 3.95 | 0.55 | 0.96 | 0.024 | 0.53 | 4 | 6 | BAL. | 275 | 32 | ABSENT | 0.155 |
| | 4 | 2.50 | 0.78 | 0.93 | 0.025 | 0.51 | 10 | 4 | BAL. | 271 | 34 | ABSENT | 0.161 |
| | 5 | 2.48 | 0.96 | 0.97 | 0.023 | 0.53 | 5 | 9 | BAL. | 277 | 36 | ABSENT | 0.154 |
| | 6 | 2.53 | 0.53 | 0.11 | 0.025 | 0.55 | 10 | 5 | BAL. | 262 | 39 | ABSENT | 0.163 |
| | 7 | 2.56 | 0.52 | 1.97 | 0.025 | 0.52 | 3 | 5 | BAL. | 265 | 33 | ABSENT | 0.164 |
| | 8 | 2.46 | 0.54 | 1.04 | 0.016 | 0.54 | 4 | 2 | BAL. | 261 | 35 | ABSENT | 0.163 |
| | 9 | 2.54 | 0.55 | 0.96 | 0.049 | 0.53 | 4 | 3 | BAL. | 267 | 36 | ABSENT | 0.162 |
| | 10 | 2.51 | 0.53 | 0.98 | 0.026 | 0.052 | 3 | 4 | BAL. | 263 | 39 | ABSENT | 0.115 |
| | 11 | 2.50 | 0.54 | 0.96 | 0.024 | 0.98 | 16 | 13 | BAL. | 268 | 31 | ABSENT | 0.216 |

TABLE 2

| TEST PIECES | | CHEMICAL COMPOSITION (WT %) | | | | | IMPURITIES (ppm) | | Cu AND OTHER IMPURITIES | HARD-NESS (Hv) | ELECTRIC CONDUCTIVITY (% IACS) | SOLDER-HEAT EXFOLIATION | BONDING STRENGTH (kgf/mm²) |
|---|---|---|---|---|---|---|---|---|---|---|---|---|---|
| | | Ni | Si | Zn | Mg | Sn | S | C | | | | | |
| CONVENTIONAL LEAD FRAME MATERIALS | 1 | 2.07 | 0.57 | 0.96 | 0.025 | — | 15 | 12 | BAL. | 248 | 45 | ABSENT | 0.101 |
| | 2 | 2.48 | 0.52 | 1.03 | 0.027 | — | 14 | 6 | BAL. | 262 | 40 | ABSENT | 0.098 |
| | 3 | 3.95 | 0.53 | 0.95 | 0.025 | — | 18 | 24 | BAL. | 273 | 35 | ABSENT | 0.087 |
| | 4 | 2.48 | 0.87 | 1.03 | 0.026 | — | 17 | 26 | BAL. | 273 | 35 | ABSENT | 0.105 |
| | 5 | 2.53 | 0.94 | 0.97 | 0.024 | — | 16 | 9 | BAL. | 274 | 39 | ABSENT | 0.089 |
| | 6 | 2.50 | 0.55 | 0.13 | 0.026 | — | 14 | 22 | BAL. | 261 | 43 | ABSENT | 0.106 |
| | 7 | 2.53 | 0.53 | 1.96 | 0.027 | — | 19 | 13 | BAL. | 263 | 36 | ABSENT | 0.107 |
| | 8 | 2.59 | 0.56 | 0.94 | 0.015 | — | 13 | 7 | BAL. | 263 | 42 | ABSENT | 0.104 |
| | 9 | 2.52 | 0.51 | 0.98 | 0.046 | — | 13 | 29 | BAL. | 264 | 39 | ABSENT | 0.107 |

TABLE 3

| | | CHEMICAL COMPOSITION (WT %) | | | | | | | | | | |
|---|---|---|---|---|---|---|---|---|---|---|---|---|
| | | | | | | | IMPURITIES (ppm) | | Cu AND OTHER IMPURITIES | HARDNESS | ELECTRIC CONDUCTIVITY | SOLDER-HEAT EXFOLI- | BONDING STRENGTH |
| TEST PIECES | | Ni | Si | Zn | Mg | Sn | S | C | | (Hv) | (% IACS) | ATION | (kgf/mm$^2$) |
| COMPARA- | 1 | 0.76* | 0.55 | 0.95 | 0.025 | 0.51 | 4 | 4 | BAL. | 187 | 53 | ABSENT | 0.178 |
| TIVE | 2 | 4.51* | 0.52 | 0.93 | 0.023 | 0.53 | 3 | 4 | BAL. | 277 | 27 | ABSENT | 0.150 |
| LEAD | 3 | 2.51 | 0.06* | 0.96 | 0.024 | 0.54 | 4 | 4 | BAL. | 184 | 26 | ABSENT | 0.182 |
| FRAME | 4 | 2.56 | 0.52 | 0.05* | 0.026 | 0.52 | 6 | 5 | BAL. | 261 | 40 | ABSENT | 0.164 |
| MATERI- | 5 | 2.52 | 0.53 | 2.31* | 0.023 | 0.55 | 5 | 8 | BAL. | 266 | 28 | ABSENT | 0.165 |
| ALS | 6 | 2.53 | 0.54 | 0.98 | 0.025 | 0.54 | 24* | 4 | BAL. | 264 | 37 | ABSENT | 0.095 |
| | 7 | 2.55 | 0.52 | 0.96 | 0.024 | 0.56 | 9 | 25* | BAL. | 265 | 37 | ABSENT | 0.089 |

NOTE:
Symbol * indicates a value outside the range according to the present invention.

What is claimed is:

1. A lead frame material formed of a CU alloy for use in a resin sealed type semiconductor device, wherein said Cu alloy consists essentially, by weight percent, of 2.0 to 3.8% Ni, 0.51 to 0.9% Si, 0.2 to 1.5% Zn, 0.015 to 0.03% Mg, 0.15 to 0.8% Sn, and the balance being Cu and inevitable impurities, said inevitable impurities containing 15 ppm or less sulfur (S) and 10 ppm or less carbon (C).

2. The lead frame material of claim 1, wherein said copper alloy consists essentially of 2.50% Ni, 0.78% Si, 0.93% Zn, 0.025% Mg, 0.51% Sn, 10 ppm S, 4 ppm C, and the balance being copper.

3. The lead frame material of claim 1, wherein aid copper alloy consists essentially of 2.46% Ni, 0.54% Si, 1.04% Zn, 0.016% Mg, 0.54% Sn, 4 ppm S, 2 ppm C, and the balance being copper.

4. In a semiconductor device having leads, the improvement comprising said leads comprising a Cu alloy which consists essentially, by weight percent, of 2.0 to 3.8% Ni, 0.51 to 0.9% Si, 0.2 to 1.5% Zn, 0. 015 to 0.03% Mg, 0.15 to 0.8% Sn, and the balance being Cu and inevitable impurities, said inevitable impurities containing 15 ppm or less sulfur (S) and 10 ppm or less carbon (C).

5. The lead frame material of claim 1, wherein said copper alloy consists essentially of 2.53% Ni, 0.52% Si, 0.98% Zn, 0.023% Mg, 0.56% Sn, 3 ppm S, 3 ppm C, and the balance copper.

6. The semiconductor device of claim 4, wherein said copper alloy consists essentially of 2.53% Ni, 0.52% Si, 0.98% Zn, 0.023% Mg, 0.56% Sn, 3 ppm S, 3 ppm C, and the balance being copper.

7. The semiconductor device of claim 4, wherein said copper alloy consists essentially of 2.50% Ni, 0.78% Si, 0.93% Zn, 0.025% Mg, 0.51% Sn, 10 ppm S, 4 ppm C, and the balance being copper.

8. The semiconductor device of claim 4, wherein said copper alloy consists essentially of 2.46% Ni, 0.54% Si, 1.04% Zn, 0.016% Mg, 0.54% Sn, 4 ppm S, 2 ppm C, and the balance being copper.

* * * * *